United States Patent
Xu et al.

(10) Patent No.: US 8,116,078 B2
(45) Date of Patent: Feb. 14, 2012

(54) SERVER AUXILIARY OPERATING SYSTEM

(75) Inventors: Ji-Peng Xu, Shanghai (CN); Tsai-Kuei Cheng, Taipei (TW); Shyn-Ren Chen, Taipei (TW); Banks Chen, Taipei (TW)

(73) Assignee: Inventec Corporation, Taipei (TW)

( * ) Notice: Subject to any disclaimer, the term of this patent is extended or adjusted under 35 U.S.C. 154(b) by 118 days.

(21) Appl. No.: 12/773,449

(22) Filed: May 4, 2010

(65) Prior Publication Data
US 2011/0222227 A1    Sep. 15, 2011

(30) Foreign Application Priority Data
Mar. 15, 2010   (CN) .......................... 2010 1 0126086

(51) Int. Cl.
*H05K 7/20*   (2006.01)
*G06F 15/00*   (2006.01)

(52) U.S. Cl. ........ 361/695; 361/721; 361/784; 361/796; 345/502; 710/301; 710/302

(58) Field of Classification Search .................. None
See application file for complete search history.

(56) References Cited

U.S. PATENT DOCUMENTS

| | | | | |
|---|---|---|---|---|
| 6,115,250 | A  * | 9/2000 | Schmitt | 361/695 |
| 6,574,100 | B1 * | 6/2003 | Anderson | 361/679.5 |
| 6,768,640 | B2 * | 7/2004 | Doblar et al. | 361/695 |
| 6,795,314 | B1 * | 9/2004 | Arbogast et al. | 361/695 |
| 6,950,895 | B2 * | 9/2005 | Bottom | 710/301 |
| 7,481,704 | B2 * | 1/2009 | Kao et al. | 454/184 |
| 7,576,745 | B1 * | 8/2009 | de Waal et al. | 345/502 |
| 7,710,741 | B1 * | 5/2010 | Kelleher et al. | 361/803 |
| 7,817,430 | B2 * | 10/2010 | Sherrod et al. | 361/724 |
| 7,839,624 | B2 * | 11/2010 | Lin | 361/679.02 |
| 7,864,523 | B2 * | 1/2011 | Iwakiri | 361/679.49 |

* cited by examiner

*Primary Examiner* — Boris Chervinsky
(74) *Attorney, Agent, or Firm* — J.C. Patents

(57) ABSTRACT

A server auxiliary operating system is disclosed, which includes a case, a plurality of swappable GPUs and a printed circuit back plane. The case includes a bottom board and a first mounting bay located at the front portion of the case. The swappable GPUs are disposed in the first mounting bay. The printed circuit back plane is disposed on the bottom board and has a plurality of first interfaces and a plurality of second interfaces electrically corresponding to the first interfaces, wherein the swappable GPUs are respectively coupled to the first interfaces, and the servers are respectively electrically connected to the corresponding swappable GPUs through the second interfaces respectively connected to the servers so as to expand the server operation capability.

13 Claims, 8 Drawing Sheets

SERVER AUXILIARY OPERATING SYSTEM

CROSS-REFERENCE TO RELATED APPLICATION

This application claims the priority benefit of P.R.C. patent application serial no. 201010126086.4, filed on Mar. 15, 2010. The entirety of the above-mentioned patent application is hereby incorporated by reference herein and made a part of specification.

BACKGROUND OF THE INVENTION

1. Field of the Invention

The present invention generally relates to an operation processing system, and more particularly, to a server auxiliary operating system able to increase the computing capability of the server.

2. Description of Related Art

Along with the increasing programmable capability and performance of a graphic processing unit (GPU), the application developers have been hoping that the graphic hardware is able to solve the high-density computation jobs which are accomplished by a central processing unit (CPU) before. The GPU executes codes in parallel mode of single instruction multiple data (SIMD), and the code for vector addition extracts two elements to be added from a memory and then performs the vector addition according to the positions of fragments. Meanwhile, the code allocates the result with the output colour. An output memory stores the vector addition, so that the value of the vector addition can be arbitrarily used in the next computation. Thanks for the super-intensive huge parallel computation function of a GPU, the computation capability thereof is far beyond the CPU and other processors. As a result, the GPU serves not only as a plotting engine, but also as the major computing engine of a PC in future.

The GPU card usually serves as an external adaptor card of a server and is disposed in the server case. However, limited by the server case space and the interface number, usually only a certain number of the GPU cards are supported, which limits expanding the server performance. How to implement an appropriate match between a server and GPU cards and expand the quantity of the GPU cards according to the demand of the clients so as realize a flexible configuration have become a significant issue to be solved by the manufacturers.

SUMMARY OF THE INVENTION

Accordingly, the present invention is directed to a server auxiliary operating system for increasing the server computation capability.

The present invention is also directed to an integrated case system, which is directly mounted in a chassis and able to expand the server computation capability but without occupying an additional volume of the server case.

The present invention provides a server auxiliary operating system, which includes a case, a plurality of swappable GPUs and a printed circuit back plane. The case includes a bottom board and a first mounting bay located at the front portion of the case.

The swappable GPUs are disposed in the first mounting bay and the said swappable GPUs can not independently work. The printed circuit back plane is disposed on the bottom board and has a plurality of first interfaces and a plurality of second interfaces electrically corresponding to the first interfaces, wherein the swappable GPUs are respectively coupled to the first interfaces, and the second interfaces are exposed to the rear portion of the case and suitable to be connected to the servers. The servers are respectively electrically connected to the corresponding swappable GPUs through the second interfaces respectively connected to the servers so as to expand the server operation capability.

In an embodiment of the present invention, the above-mentioned case further includes a second mounting bay located at the rear portion of the case for disposing another set of swappable GPUs in the second mounting bay. It should be noted that the present invention breaks through the limitation of the space and the interface number so as to more expand functions, and the flexibility of the disposition is helpful for meeting the various demands of the users.

In an embodiment of the present invention, each of the above-mentioned swappable GPUs includes a mounting and fixing casing, a GPU card and a bridge circuit board, wherein the GPU card is disposed in the mounting and fixing casing and electrically connected to a first interface through the bridge circuit board.

In an embodiment of the present invention, the above-mentioned bridge circuit board has a slot disposed thereon for the GPU card to be inserted and a connector electrically connected to a first interface.

In an embodiment of the present invention, the positions of the above-mentioned slots and the positions of the GPU cards are corresponding to each other in the vertical direction, while the positions of the connectors and the positions of the first interfaces are corresponding to each other in the horizontal direction.

In an embodiment of the present invention, a plurality of riser cards are uprightly disposed on the above-mentioned printed circuit back plane, and the second interfaces are disposed on the riser cards.

In an embodiment of the present invention, the above-mentioned case further includes a power-fixing bay for accommodating a plurality of power supply units in the power-fixing bay, and the power-fixing bay has a movable bottom board leaning against the upper portions of the riser cards.

In an embodiment of the present invention, the above-mentioned power-fixing bay is movably mounted between a side wall of the case and the second mounting bay, wherein a side of the movable bottom board is fixed on the side wall of the case and another side thereof is fixed on a side wall of the second mounting bay.

In an embodiment of the present invention, the above-mentioned case further includes a fan-fixing bay for accommodating a plurality of fan units in the fan-fixing bay. The fan-fixing bay is located between the first mounting bay and the second mounting bay, the fan units are suitable to dissipate heat on the swappable GPUs in the first mounting bay and the second mounting bay, and the fan-fixing bay is disposed across over the printed circuit back plane.

In an embodiment of the present invention, the above-mentioned fan-fixing bay has a plurality of openings going through uprightly for the fan units to be inserted in the fan-fixing bay.

In an embodiment of the present invention, a plurality of fan interfaces are disposed on the above-mentioned printed circuit back plane, wherein the fan interfaces go through the bottom portion of the fan-fixing bay for electrically connecting the fan units inserted in the fan-fixing bay.

In an embodiment of the present invention, both sides of the above-mentioned fan-fixing bay respectively have an opening slot with an downward opening, two inner walls of the case respectively have a protrusive pillar thereon, the fan-fixing bay is downwards assembled in the case, and the fan-fixing bay is fixed by locking the protrusive pillar with the opening slot.

Based on the depiction above, the server auxiliary operating system of the present invention can be used in a system with super-density computations, where up to 16 pieces of the swappable GPUs can be inserted in the case so as to expand the server operation capability. In addition, the GPUs in the present invention can be designed as swappable ones so as to form a blade structure to reach the object of on-chassis quick maintenance.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
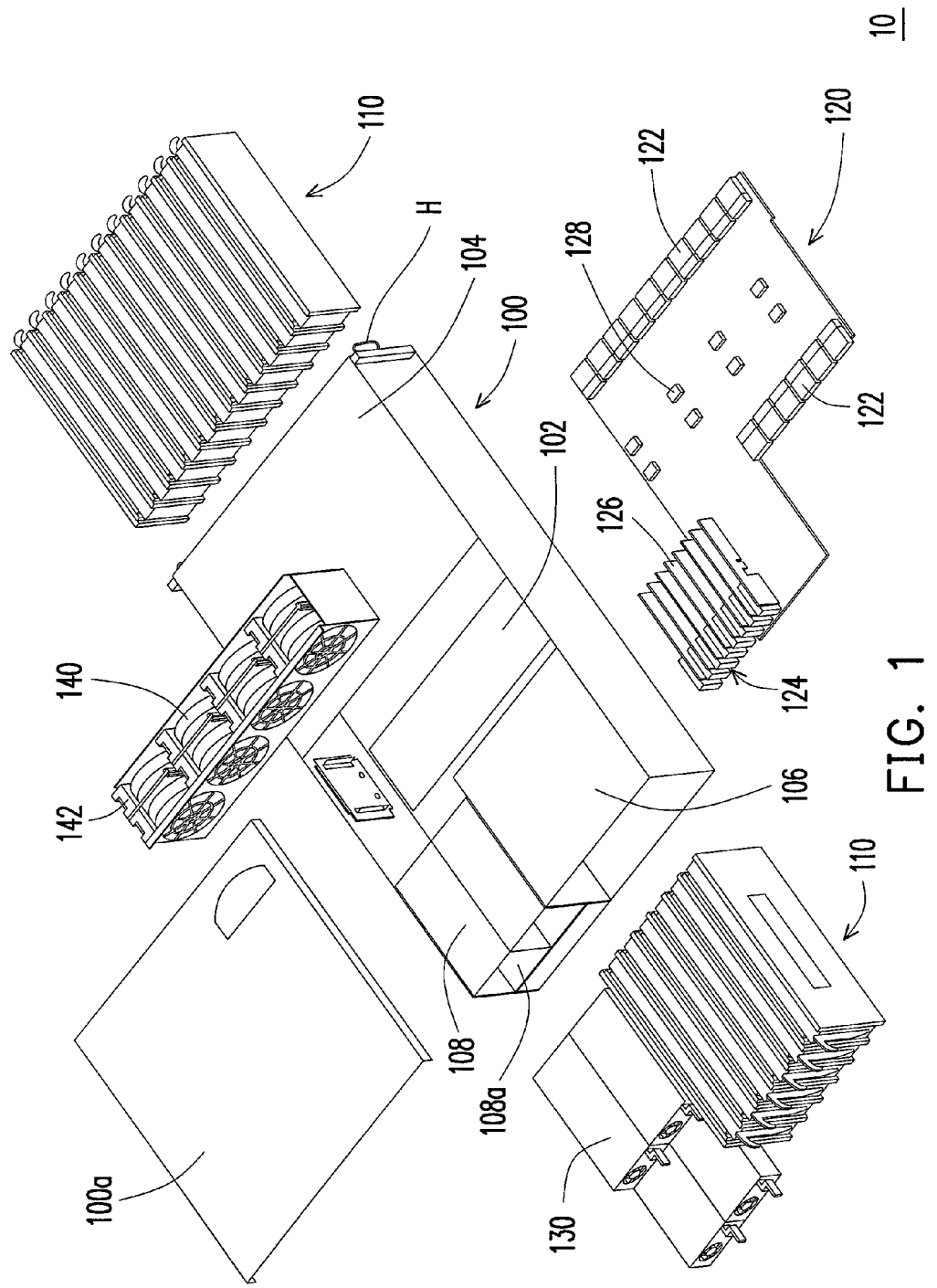
FIG. 1 is a breakdown diagram of a diagram of a server auxiliary operating system according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
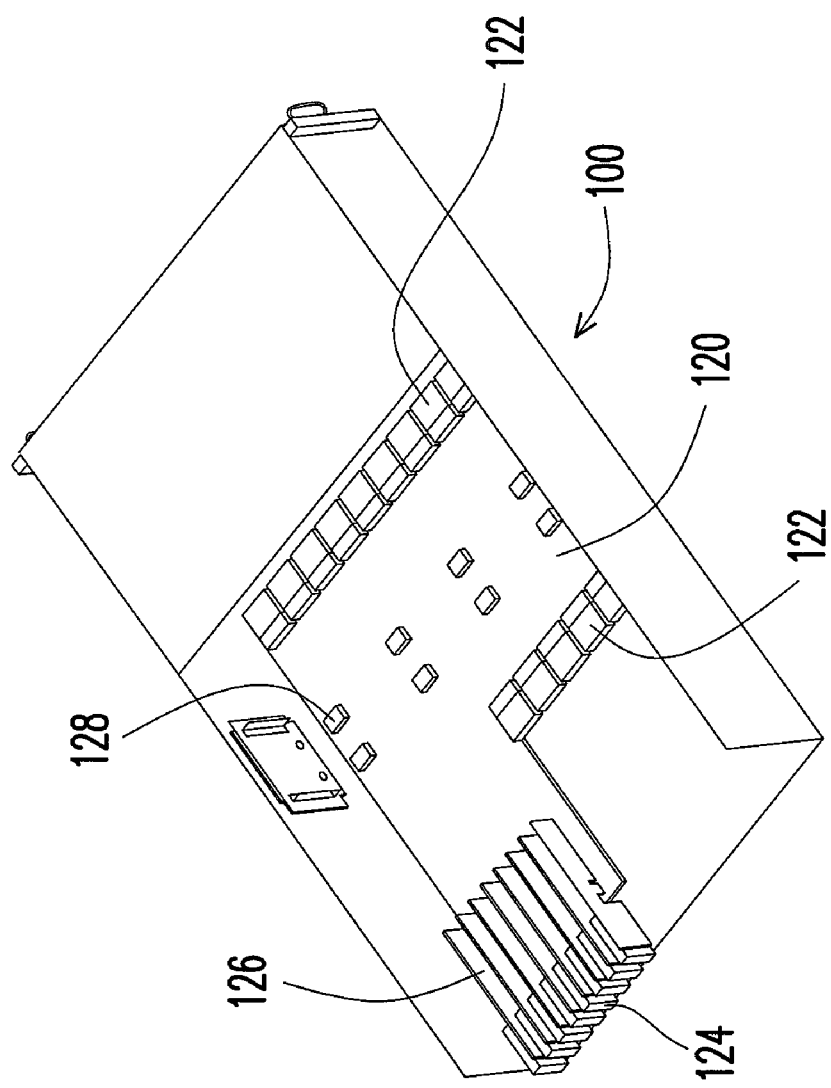
FIG. 2 is a diagram showing the printed circuit back plane in FIG. 1 is disposed in the case.
Figure 3:
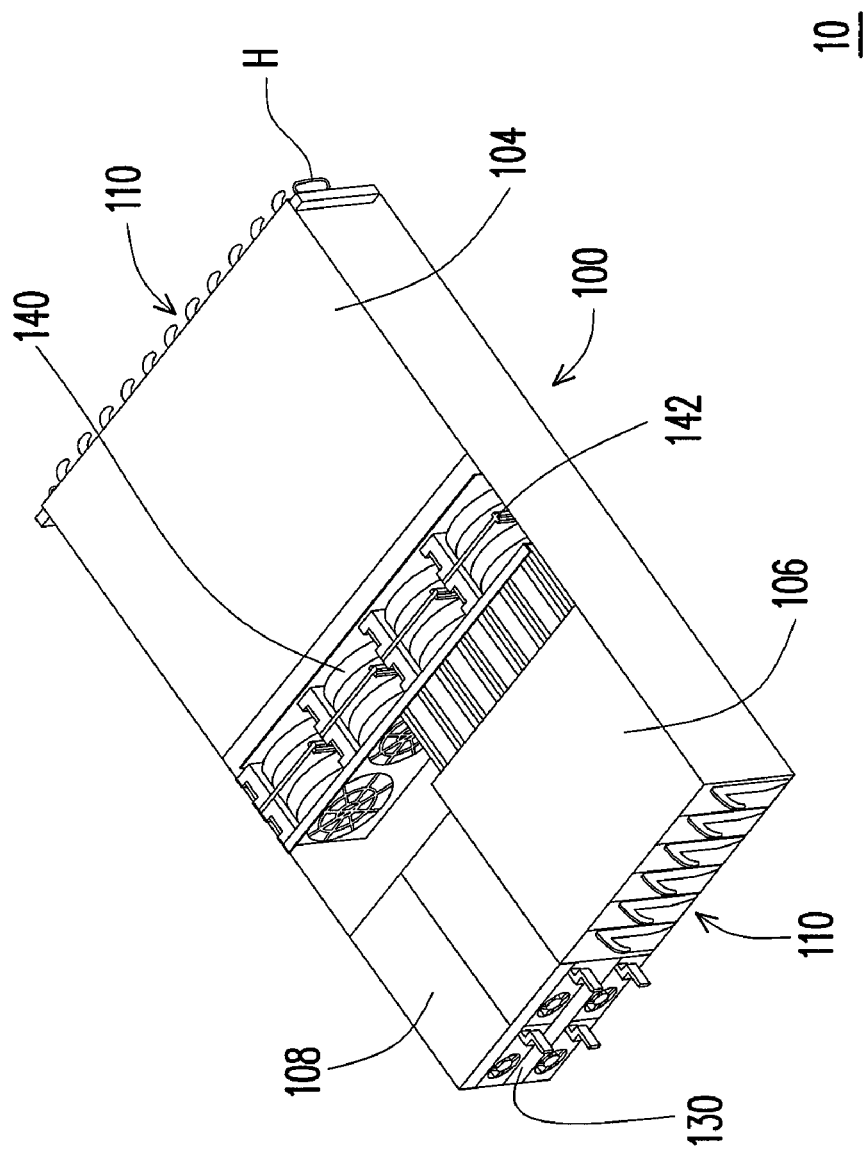
FIG. 3 is a diagram showing the swappable GPUs, the power supply units and the fan units in FIG. 1 are disposed in the case.
Figure 4A:
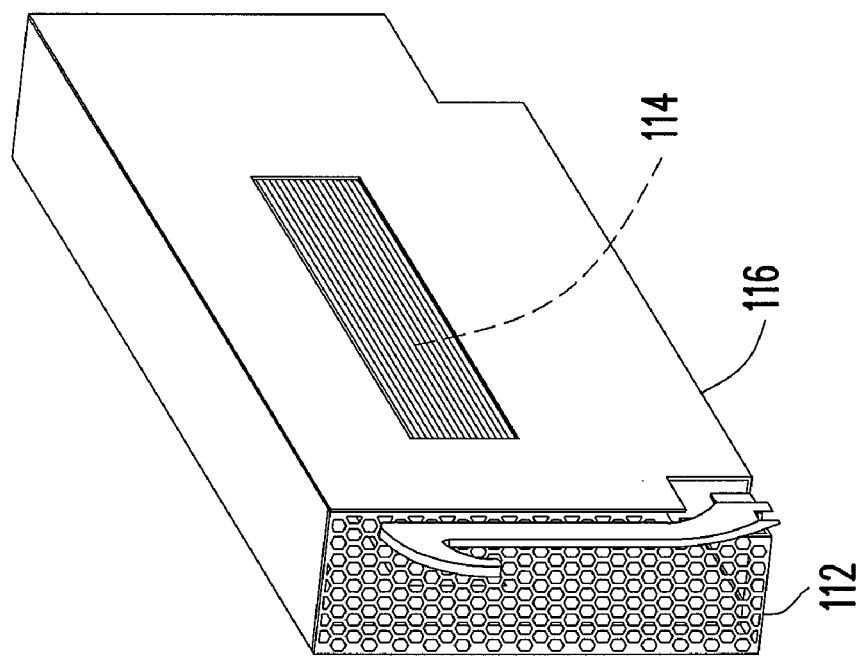
FIGS. 4A and 4B are respectively an assembly diagram and a breakdown diagram of the swappable GPUs in FIG. 1.
Figure 4B:
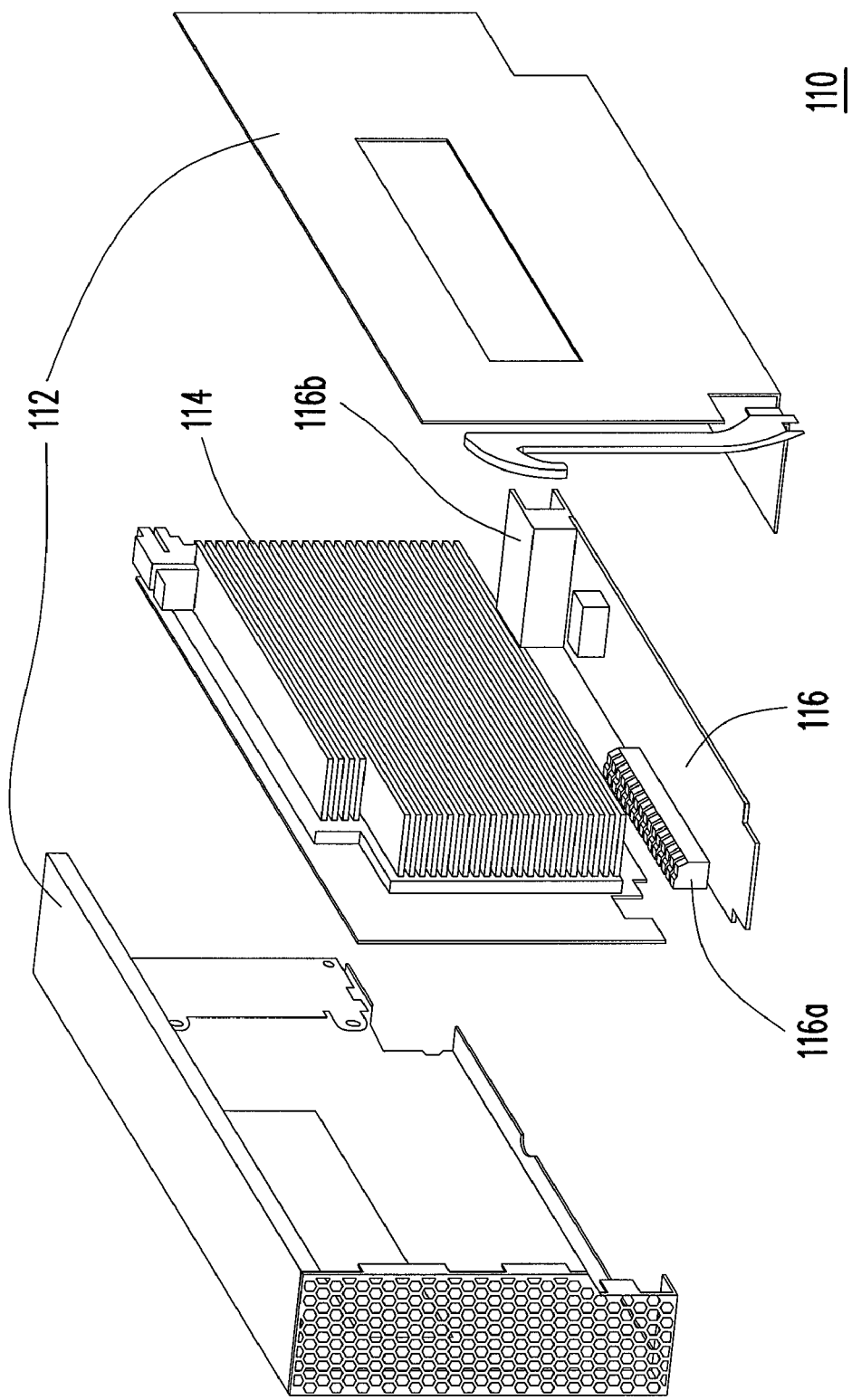
Figure 5:
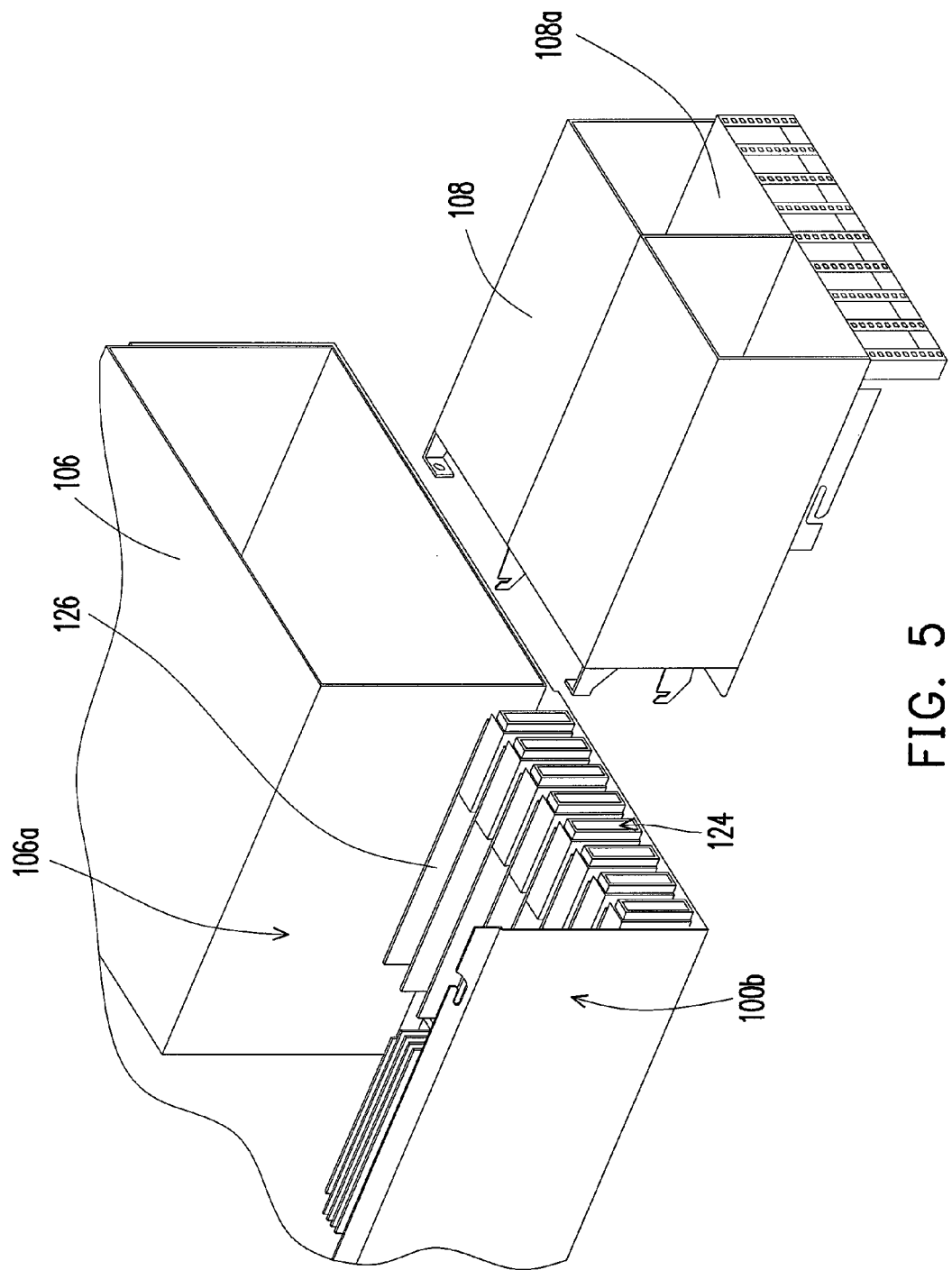
FIG. 5 is a breakdown diagram of the power-fixing bay in FIG. 1.
Figure 6A:
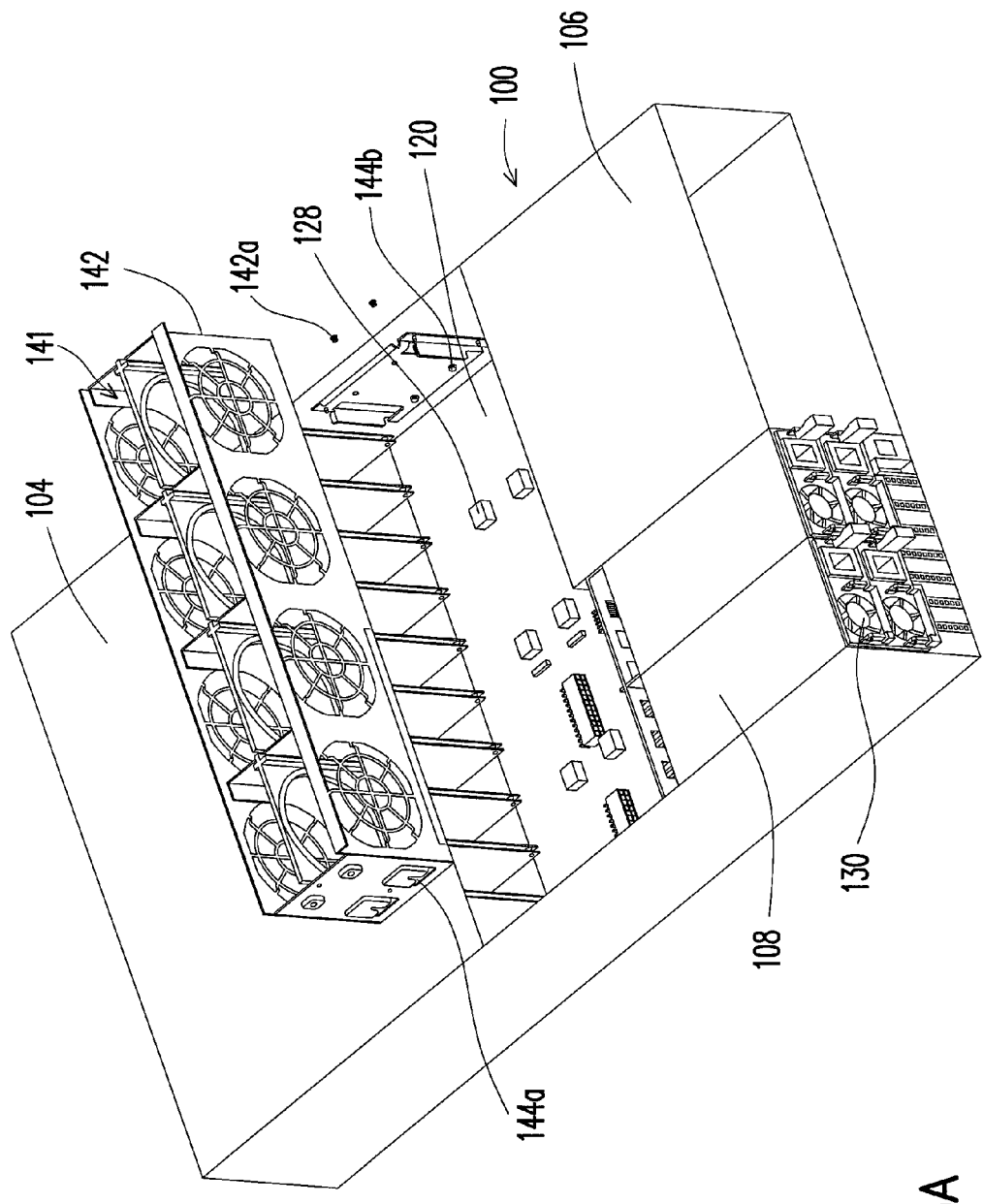
FIGS. 6A and 6B are respectively a breakdown diagram and a localized-enlarged diagram of the fan-fixing bay in FIG. 3 mounted in the case.
Figure 6B:
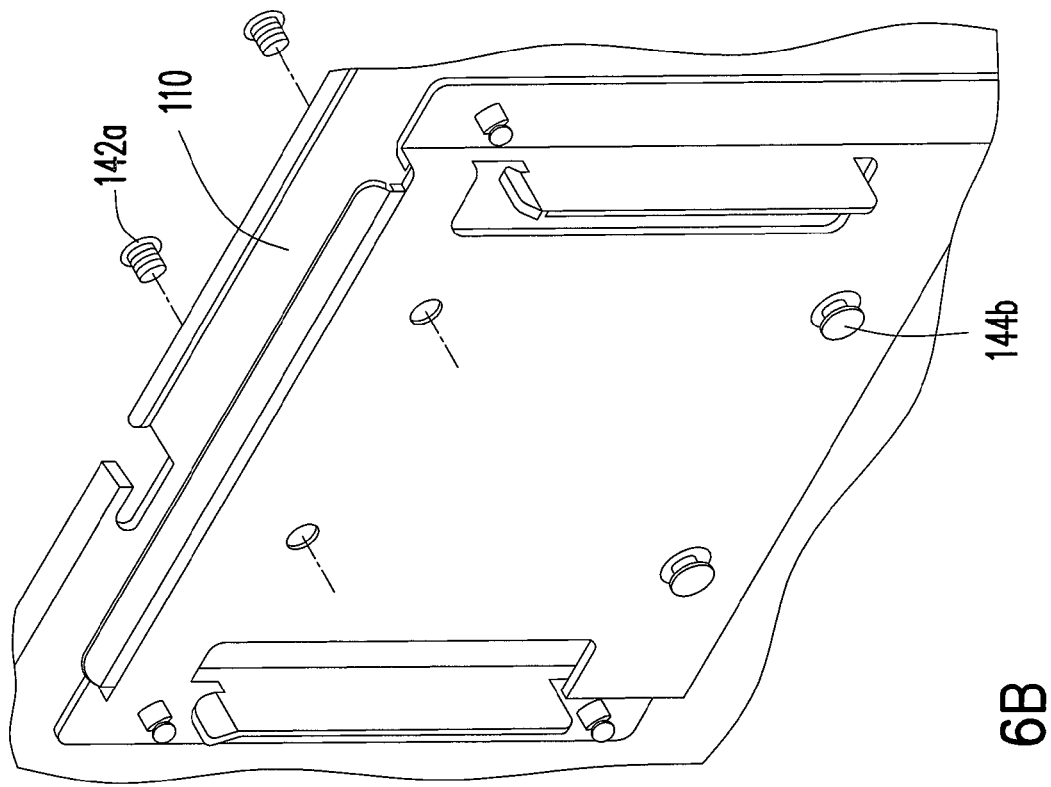
Figure 6B:
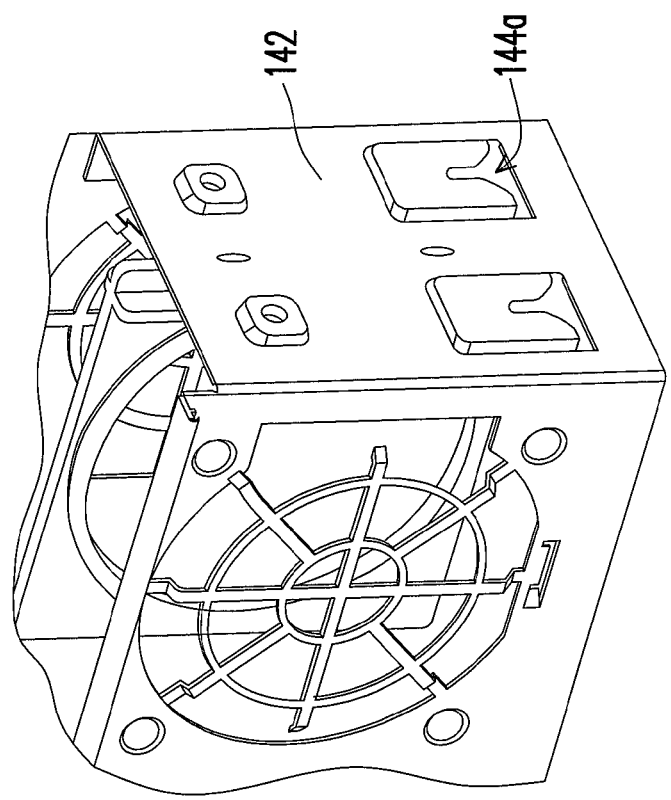

FIG. 1 is a breakdown diagram of a server auxiliary operating system according to an embodiment of the present invention. FIG. 2 is a diagram showing the printed circuit back plane in FIG. 1 is disposed in the case. FIG. 3 is a diagram showing the swappable GPUs, the power supply units and the fan units in FIG. 1 are disposed in the case. FIGS. 4A and 4B are respectively an assembly diagram and a breakdown diagram of the swappable GPUs in FIG. 1. FIG. 5 is a breakdown diagram of the power-fixing bay in FIG. 1. FIGS. 6A and 6B are respectively a breakdown diagram and a localized-enlarged diagram of the fan-fixing bay in FIG. 3 mounted in the case.

Referring to FIGS. 1, 2 and 3, a server auxiliary operating system 10 includes a case 100, a plurality of swappable GPUs 110 and a printed circuit back plane 120. The case 100 includes a bottom board 102 and a first mounting bay 104 located at the front portion of the case 100. The swappable GPUs 110 are disposed in the first mounting bay 104. The printed circuit back plane 120 is disposed on the bottom board 102 and has a plurality of first interfaces 122 and a plurality of second interfaces 124 electrically corresponding to the first interfaces 122, wherein the swappable GPUs 110 are respectively coupled to the first interfaces 122, while the servers (not shown) externally connected to the second interfaces 124 can be electrically connected to the corresponding swappable GPUs 110. In FIG. 1, an upper cover 100a can overlay the case 100 and is fastened together with the case 100. Based on the depiction above, an integrated case system is formed and the system can be directly mounted in a chassis to expand the operation capability of the servers. In addition, by means of the structure, the case system does not occupy additional capacity of the server case through connecting the servers.

In more details, referring to FIG. 1, the first mounting bay 104 is located at the front portion of the case 100 for the swappable GPUs 110 to be inserted therein. The case 100 has also a handle H located at the front side of the case 100 for being held and conveniently applying force, so that the case 100 can be conveniently pulled out or pushed in. In the embodiment, the first mounting bay 104 can accommodate at the most 10 pieces of the swappable GPUs 110, which the present invention is not limited to. The case 100 further includes a second mounting bay 106 located at the rear portion of the case 100 for being inserted by another set of the swappable GPUs 110. In the embodiment, the second mounting bay 106 can accommodate at the most 6 pieces of the swappable GPUs 110, which the present invention is not limited to. The design of a plurality of mounting bays would fully utilize the space of the case 100 and accommodate a plurality pieces of the swappable GPUs 110 as many as possible.

The first interfaces 122 are disposed at the front side and the rear side of the printed circuit back plane 120, wherein the quantity of the first interfaces 122 are equivalent to the quantity of the corresponding swappable GPUs 110. Preferably, the quantity of the first interfaces 122 can be 16 pieces or more, which the present invention is not limited to. Referring to FIGS. 1 and 5, a plurality of riser cards 126 are uprightly disposed on the printed circuit back plane 120, and the riser cards 126 are, for example, PCI-Express×16 cards. The second interfaces 124 are disposed on the riser cards 126, and they are, for example, 8 pieces of high-speed input/output interfaces to externally connect 8 pieces of servers at the host terminals, which the present invention is not limited to. The upright disposition of the riser cards 126 is advantageous in higher space utilization so that it becomes possible to dispose a plurality of second interfaces 124 in a small space.

The power-fixing bay 108 is moveably mounted between a side wall of the case 100 and the second mounting bay 106, wherein the power-fixing bay 108 is disposed over the riser cards 126 for accommodating a plurality of power supply units 130 in the power-fixing bay 108. In the embodiment, the quantity of the power supply units 130 can be 4, which the present invention is not limited to. The power-fixing bay 108 further has a movable bottom board 108a leaning against the upper portions of the riser cards 126. A side of the movable bottom board 108a is fixed (fastened) on the side wall 100b of the case 100, and another side thereof is fixed (fastened) on a side wall 106a of the second mounting bay 106. In order to install or detach the riser cards 126, the movable bottom board 108a needs to be unlocked and horizontally pulled out only, which brings great usage convenience.

Referring to FIGS. 1, 4A and 4B, the swappable GPUs 110 can be inserted in any portion or at all positions in the first mounting bay 104 or the second mounting bay 106, so that a server or a plurality of servers can be electrically connected to the corresponding swappable GPUs 110 through the connected second interfaces 124 so as to further expand the operation capability of the servers. Each of the swappable GPUs 110 includes a mounting and fixing casing 112, a GPU card 114 and a bridge circuit board 116. The GPU card 114 is disposed in the mounting and fixing casing 112 and electrically connected to a first interface 122 through the bridge circuit board 116. On the bridge circuit board 116, there is a slot 116a for the GPU card 114 to be inserted and a connector 116b electrically connected to the first interface 122. The position of the slot 116a and the position of the GPU card 114 are corresponding to each other in the vertical direction so that the GPU card 114 can be vertically disposed on the bridge circuit board 116, and the position of the connector 116b and the position of the first interface 122 are corresponding to each other in the horizontal direction so that the user can horizontally insert in or detach the swappable GPU 110.

Referring to FIGS. 1, 6A and 6B, the printed circuit back plane 120 is disposed on the bottom board 102, and a plurality of fan interfaces 128 are disposed on the printed circuit back plane 120 and go through the bottom portion of the fan-fixing bay 142. The fan interfaces 128 are electrically connected to a plurality of fan units 140 plugged in the fan-fixing bay 142 for driving every fan to run. The fan units 140 are accommodated in the fan-fixing bay 142 and the fan-fixing bay 142 are fixed in a space between the first mounting bay 104 and the second mounting bay 106 through screws 142a or retainers for absorbing shocks. The fan-fixing bay 142 is located between the first mounting bay 104 and the second mounting bay 106, and the fan units 140 is suitable to dissipate heat on all the swappable GPUs 110 in the first mounting bay 104 and the second mounting bay 106. The fan-fixing bay 142 has a plurality of openings 141 going through uprightly for the fan units 140 to be inserted in the fan-fixing bay 142 from up to down. Referring to FIG. 6B, both sides (only one side is shown) respectively have a first locking element 144a, two inner walls (only one side is shown) of the case 100 respectively have a second locking element 144b. When the first locking elements 144a and the second locking elements 144b are locked by each other, the fan-fixing bay 142 is fixed in the case 100 and the fan-fixing bay 142 is thereby disposed across over the printed circuit back plane 120. In the embodiment, the first locking element 144a can be an opening slot in downward direction and the second locking element 144b can be a protrusive pillar. When the fan-fixing bay 142 is assembled in the case 100 from up to down, the T-shaped head of the protrusive pillar goes through the bigger hole diameter of the opening slot, moving to the smaller hole diameter, to be locked therein, which makes the fan-fixing bay 142 is locked in the horizontal direction. The reverse operation of the above-mentioned steps makes the fan-fixing bay 142 detached conveniently.

In summary, the server auxiliary operating system of the present invention can be used in a super-high-density system, where up to 16 pieces of swappable GPUs 110 can be inserted in a case with 3 U height (1 U=1.75") so as to further expand the operation capability of the servers. The employed first mounting bay 104, second mounting bay 106, power-fixing bay 108 and fan-fixing bay 142 can be detached conveniently from the case, which facilitate the printed circuit back plane 120 to be flatly disposed at the bottom portion of the case. The employed GPUs can be swappable to form a blade structure so as to realize the object of on-chassis quick maintenance. In addition, the design of the mounting and fixing casing with high compatibility is able to support standard GPU card, short GPU card; extended GPU card or high-speed GPU card (with 2 slots). Furthermore, all the I/O interfaces are disposed at the rear side of the case which realizes a convenient management of cable data lines. A single network interface controller (single NIC) is disposed also at the rear side of the case which realizes a unified management of the system. Moreover, the fan units and the power supply units are also swappable by design, which realizes the object of quick mounting and maintenance and assures no worry about the dissipating heat of the system and the power supply.

It will be apparent to those skilled in the art that the descriptions above are several preferred embodiments of the present invention only, which does not limit the implementing range of the present invention. Various modifications and variations can be made to the structure of the present invention without departing from the scope or spirit of the invention.

What is claimed is:

1. A server auxiliary operating system, for expanding the computation capability of servers, the server auxiliary operating system comprising:
   a case, comprising a bottom board and a first mounting bay located at a front portion of the case;
   a plurality of swappable graphic processing units, disposed in the first mounting bay; and
   a printed circuit back plane, disposed on the bottom board, wherein the printed circuit back plane has a plurality of first interfaces and a plurality of second interfaces electrically corresponding to the first interfaces, the swappable graphic processing units are respectively coupled to the first interfaces, the second interfaces are exposed to a rear portion of the case and suitable to connect the servers, the servers are electrically connected to the corresponding swappable graphic processing units through the connected second interfaces, and the swappable graphic processing units expand the operation capability of the servers.

2. The server auxiliary operating system as claimed in claim 1, wherein the case further comprises a second mounting bay located at the rear portion of the case for disposing another set of swappable graphic processing units in the second mounting bay.

3. The server auxiliary operating system as claimed in claim 2, wherein each of the swappable graphic processing units comprises a mounting and fixing casing, a graphic processing unit (GPU) card and a bridge circuit board, wherein the GPU card is disposed in the mounting and fixing casing and electrically connected to one of the first interfaces through the bridge circuit board.

4. The server auxiliary operating system as claimed in claim 1, wherein each of the swappable graphic processing units comprises a mounting and fixing casing, a graphic processing unit (GPU) card and a bridge circuit board, wherein the GPU card is disposed in the mounting and fixing casing and electrically connected to one of the first interfaces through the bridge circuit board.

5. The server auxiliary operating system as claimed in claim 4, wherein the bridge circuit board has a slot disposed thereon for the GPU card to be inserted and a connector electrically connected to one of the first interfaces.

6. The server auxiliary operating system as claimed in claim 5, wherein the position of the slot and the positions of the GPU card are corresponding to each other in the vertical direction, while the position of the connector and the position of the first interface are corresponding to each other in the horizontal direction.

7. The server auxiliary operating system as claimed in claim 1, wherein a plurality of riser cards is uprightly disposed on the printed circuit back plane, and the second interfaces are disposed on the riser cards.

8. The server auxiliary operating system as claimed in claim 7, wherein the case further comprises a power-fixing bay for accommodating a plurality of power supply units in the power-fixing bay, and the power-fixing bay has a movable bottom board leaning against upper portions of the riser cards.

9. The server auxiliary operating system as claimed in claim 8, wherein the power-fixing bay is movably mounted between a side wall of the case and the second mounting bay, wherein a side of the movable bottom board is fixed on the side wall of the case and another side thereof is fixed on a side wall of the second mounting bay.

10. The server auxiliary operating system as claimed in claim 4, wherein the case further comprises a fan-fixing bay for accommodating a plurality of fan units in the fan-fixing bay, the fan-fixing bay is located between the first mounting bay and the second mounting bay, the fan units are suitable to dissipate heat on the swappable graphic processing units in the first mounting bay and the second mounting bay, and the fan-fixing bay is disposed across over the printed circuit back plane.

11. The server auxiliary operating system as claimed in claim 10, wherein the fan-fixing bay has a plurality of openings going through uprightly for the fan units to be inserted in the fan-fixing bay.

12. The server auxiliary operating system as claimed in claim 11, wherein a plurality of fan interfaces are disposed on the printed circuit back plane, and the fan interfaces go through the bottom portion of the fan-fixing bay for electrically connecting the fan units inserted in the fan-fixing bay.

13. The server auxiliary operating system as claimed in claim 10, wherein both sides of the fan-fixing bay respectively have an opening slot with an downward opening, two inner walls of the case respectively have a protrusive pillar thereon, the fan-fixing bay is downwards assembled in the case, and the fan-fixing bay is fixed by locking the protrusive pillar with the opening slot.

* * * * *